(12) United States Patent
Reiss et al.

(10) Patent No.: US 6,346,294 B1
(45) Date of Patent: Feb. 12, 2002

(54) PROCESS FOR PRODUCING A NON-WETTABLE AMORPHOUS CARBON COATING ON A COMPONENT

(75) Inventors: Harald Reiss, Heidelberg; Manfred Wetzko, Wilhelmsfeld, both of (DE)

(73) Assignee: ABB Patent GmbH, Ladenburg (DE)

( * ) Notice: Subject to any disclaimer, the term of this patent is extended or adjusted under 35 U.S.C. 154(b) by 0 days.

(21) Appl. No.: 09/301,135

(22) Filed: Apr. 28, 1999

Related U.S. Application Data

(63) Continuation of application No. PCT/EP97/05830, filed on Oct. 22, 1997.

(30) Foreign Application Priority Data

Oct. 28, 1996 (DE) .......................................... 196 44 692

(51) Int. Cl.$^7$ .............................................. C23C 16/26
(52) U.S. Cl. ...................... 427/307; 427/309; 427/534; 427/577; 427/249.1; 204/192.16
(58) Field of Search ................................ 427/534, 577, 427/249.1, 255.18, 255.17, 255.393, 307, 309; 204/192.16

(56) References Cited

U.S. PATENT DOCUMENTS

| 4,981,071 A | * | 1/1991 | Enke |
| 5,073,785 A | * | 12/1991 | Jansen et al. |
| 5,328,761 A | * | 7/1994 | Omori et al. |

FOREIGN PATENT DOCUMENTS

| GB | 1069535 | * 5/1967 |
| JP | 08337874 | * 12/1996 |

* cited by examiner

*Primary Examiner*—Timothy Meeks
(74) *Attorney, Agent, or Firm*—Herbert L. Lerner; Laurence A. Greenberg; Werner H. Stemer

(57) ABSTRACT

A process for producing a coating on components having peripheries to be placed in direct contact with vaporous media. Such peripheries are wetted over part or all of their surface with a film of liquid when the vaporous media are changed from the vapor state into the liquid state by phase transition. Such films of liquid increase the thermal resistance, for example, of the components. In order to avoid such wetting, the peripheries of each component are roughened. A coat of a non-wettable, amorphous carbon is then applied to the peripheries, at least in regions thereof.

4 Claims, 3 Drawing Sheets

PROCESS FOR PRODUCING A NON-WETTABLE AMORPHOUS CARBON COATING ON A COMPONENT

CROSS-REFERENCE TO RELATED APPLICATION

This application is a continuation of copending International Application No. PCT/EP97/05830, filed Oct. 22, 1997, which designated the United States.

BACKGROUND OF THE INVENTION

FIELD OF THE INVENTION

The invention relates to a process for producing a coating on components having peripheries which are brought into direct contact with vapor and/or condensate of a medium.

Such coatings are provided, for example, for components having peripheries which are brought into direct contact with vaporous media.

Pipelines for coolants of condensers which form part of power plants have heretofore been wetted over part or all of their surface with a film of liquid when the working fluid which is used for conveying heat at such pipelines is changed from its vapor state into its liquid state by phase transition.

Due to the comparatively low thermal conductivity of the working fluid, those films of liquid represent a thermal resistance which makes up about 30% of the overall thermal resistance. The overall thermal resistance is composed of convective thermal resistance at an interface between coolant and inner surfaces of the pipelines of the condenser, thermal resistance of material of the pipe, thermal resistance of any precipitation on the pipelines or non-condensible vapors and thermal resistance which is produced by the above-mentioned phase transition at an outer surface of the pipeline.

Furthermore, such a continuous film of liquid increases the flow resistance which the vaporous working fluid has to overcome when it flows through spaces between the pipelines, since frictional forces occur between vapor and condensate.

Such film condensation not only entails those drawbacks, but may also lead to contamination of and precipitation on the components if corresponding substances are entrained or dissolved in the working fluid. Such precipitation may in turn further increase the thermal resistance at the peripheries of the pipelines.

SUMMARY OF THE INVENTION

It is accordingly an object of the invention to provide a process for producing a coating on components, which overcomes the hereinafore-mentioned disadvantages of the heretofore-known processes of this general type in such a way that the coating can be used to prevent films of liquid developing on peripheries of components and formation of solid precipitation.

With the foregoing and other objects in view there is provided, in accordance with the invention, a process for producing a coating on components having peripheries to be brought into direct contact with vapor and/or condensate of a medium, which comprises roughening the peripheries of the components to a depth of up to 20 $\mu$m; applying to the peripheries a coat up to 5 $\mu$m thick of a non-wettable, amorphous carbon with a structural formula: a-C:H:X, where X is the chemical element fluorine or silicon, to produce coated surfaces having uncoated regions and regions coated with non-wettable, amorphous carbon; and then smoothing the coated surfaces to produce an overall surface area of the uncoated regions being less than 50% of an overall surface area of the regions coated with non-wettable, amorphous carbon.

With the objects of the invention in view, there is also provided a process for producing a coating on components having peripheries to be brought into direct contact with vapor and/or condensate of a medium, which comprises roughening the peripheries of each of the components to a depth of between 0.1 $\mu$m and 2 $\mu$m; and applying to the peripheries a 3 $\mu$m to 5 $\mu$m thick coat of a non-wettable, amorphous carbon with a structural formula: a-C:H:X, where X is the chemical element fluorine or silicon.

It is possible to prevent the formation of a continuous film of condensate with the aid of a coat of non-wettable, amorphous carbon on the peripheries of components which are in direct contact with the vapor and/or the condensate of a medium. Above all, such a coat achieves the effect that the working fluid, that is used for conveying heat in power plants, only precipitates in the condenser in the form of drops on the surfaces of pipelines through which a coolant is fed. The heat transmission coefficient of the condenser is thus increased by about 5 to 15%. Since these measures also reduce the pressure drop of the working fluid as it flows through the spaces between the pipelines, the vacuum of the condenser can be reduced by about 4 to 8 hPa at a condenser design pressure of about 50 hPa.

In order to reduce the thermal resistance between the coat of non-wettable, amorphous carbon and a component, the latter is roughened before being coated with amorphous carbon to such an extent that the effective interface between component and coating is increased. The increase depends on the structure of the roughness and the depth of the roughening. The peripheries of the component which are to be coated are preferably roughened to a depth of between 0.1 and 2 $\mu$m. The roughening is carried out by chemical or physical etching. Plasma etching is preferably employed. In this way, the effective interface is increased by a factor of 1.5 to 2. During the subsequent coating, the coat is applied to such a thickness that a continuous and smooth surface of non-wettable, amorphous carbon is formed, on which the vapor can condense.

A further improvement to the heat transfer between a vaporous working fluid and a component coated with non-wettable, amorphous carbon can be achieved by roughening the peripheries to be coated to a depth of 20 $\mu$m using one of the processes described above. Then the coat is only applied to such a thickness that the peripheries are covered with the non-wettable, amorphous carbon, but smooth surfaces are not formed. These surfaces are then smoothed mechanically. The result is the formation of surfaces which have both uncoated regions of the peripheries and regions which are coated with non-wettable, amorphous carbon. After smoothing, the overall surface area of the uncoated regions is less than 50% of the overall surface area of the coated regions. These measures ensure that the vaporous working medium continues to condense in drop form on the component. The direct contact between the vaporous working medium and the uncoated peripheries of the component results in an improved heat transfer.

In the case of components having peripheries which are not provided with the coat according to the invention, drops formed during the condensation of vaporous media are extended in such a manner that they flow into one another and form continuous layers of liquid. A measure of the non-wettability of a surface by a liquid is the wetting angle of contact. The coating according to the invention is formed in such a way that the stationary wetting angle of contact between the coat and the liquid is greater than 90 degrees. This means that the vaporous working fluid condenses only in the form of drops on the coated surfaces. Condensates which form, for example, in a power-plant condenser therefore do not produce a continuous film on surfaces which are coated with a non-wettable, organically modified ceramic. The interface interactions between the coat and the working fluid in this case are so minor that the drops do not adhere to the surfaces, or do so only slightly. Ultimately, they rundown off the surfaces of the pipelines under the force of gravity, entraining other drops and forming free areas on the surfaces of the pipelines, in which areas vaporous working fluid can again condense. The fact that the drops quickly run off means that the residence time of the working fluid on the pipelines is reduced and thus the build-up of an increased thermal resistance by a film of condensate is prevented.

Coats of non-wettable amorphous carbon are produced by introducing fluorine or silicon during the deposition. Non-wettable, amorphous carbon can be represented by the following structural formula: a-C:H:X, where a represents amorphous and X represents the chemical elements fluorine or silicon. Non-wettable, amorphous carbon has a low surface energy of about 20 $mJ/m^2$. Nevertheless, it has a surface hardness of about 1500 $H_v$ and thus a high abrasion resistance. Surfaces of components which have a coat of non-wettable, amorphous carbon additionally offer the advantage that it is not possible for precipitation, which is caused, for example, by small particles or dissolved substances entrained by a working fluid, to form on them. Oxide layers are also unable to form on such a coat.

Other features which are considered as characteristic for the invention are set forth in the appended claims.

Although the invention is illustrated and described herein as embodied a process for producing a coating on components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
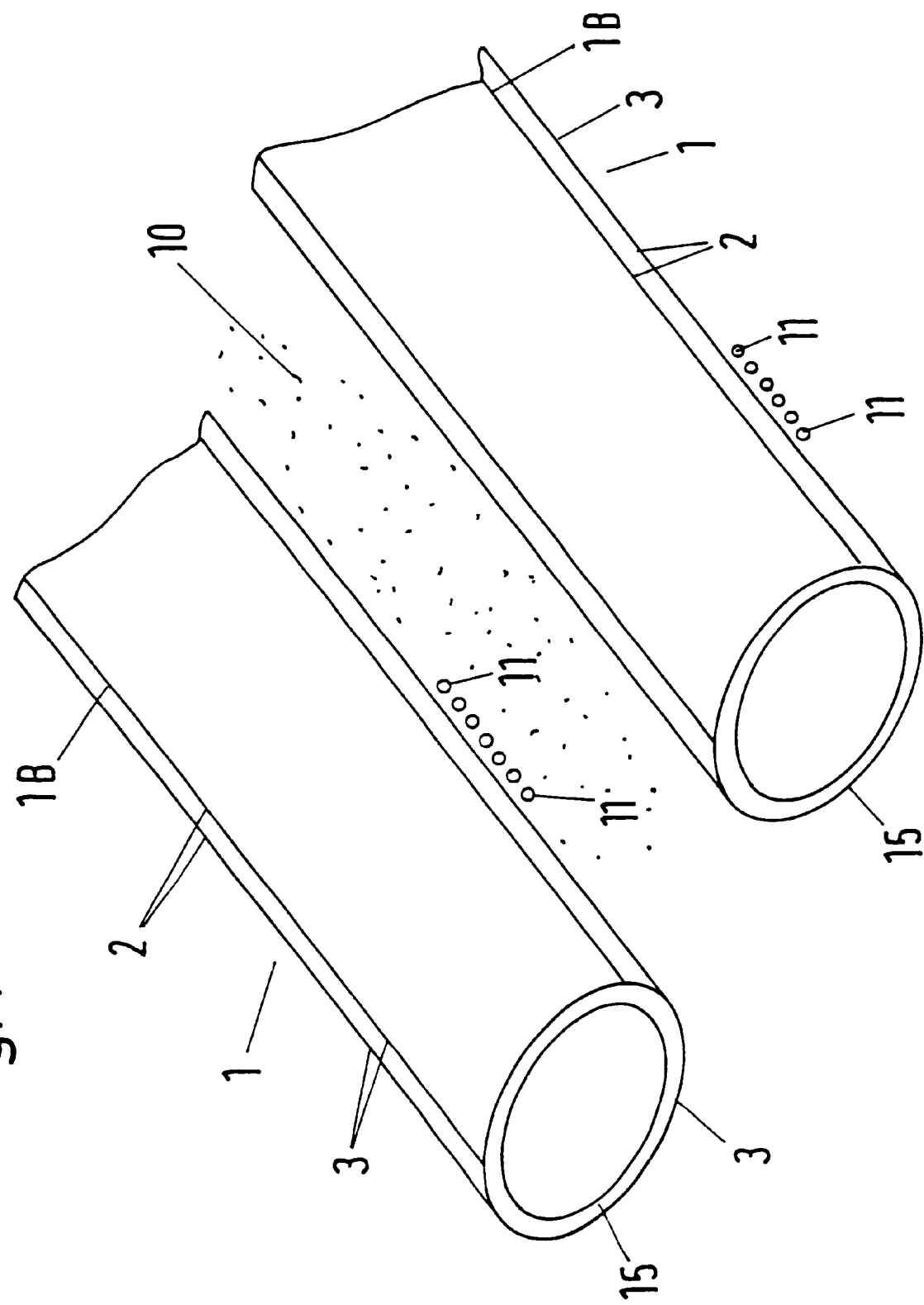
FIG. 1 is a fragmentary, diagrammatic, perspective view showing components having a coating according to the invention.

Referring now to the figures of the drawings in detail and first, particularly, to FIG. 1 thereof, there are seen two tubular components 1 made of metal. The components 1 belong to a bundle of pipelines of a condenser which forms part of a non-illustrated power plant. The two components 1 are produced from titanium and each have a wall thickness of 0.5 to 0.7 mm. They are disposed at a wall-to-wall separation of about 5 mm to 10 mm. Each of the two components 1 is provided on its outer surface 15 with a coating 2. In the exemplary embodiment described herein, this coating 2 is formed by a smooth coat 3 which covers the whole area and is made of a non-wettable, amorphous carbon which can be represented by the following structural formula: a-C:H:X, where X stands for the chemical elements fluorine or silicon.

In order to reduce thermal resistance between the coatings 2 and the components 1, peripheries 1B are roughened prior to coating, in such a manner that an effective interface between the components 1 and the coatings 2 is increased. This increase depends on the structure of the roughness and the depth of the roughening. The peripheries 1B to be coated are preferably roughened to a depth of between 0.1 and 2 $\mu$m. The roughening is carried out, for example, by chemical or physical etching. The roughening is preferably carried out through the use of plasma etching, which increases the effective interface by a factor of about 1.5 to 2. In the subsequent coating of the peripheries 1B, the coat 3 is applied to a thickness of 3 to 5 $\mu$m. Chemical gas-phase depositions or physical coating techniques can be used to apply the coat 3. The coat 3 is preferably applied by plasma-activated deposition or sputtering.

Figure 2:
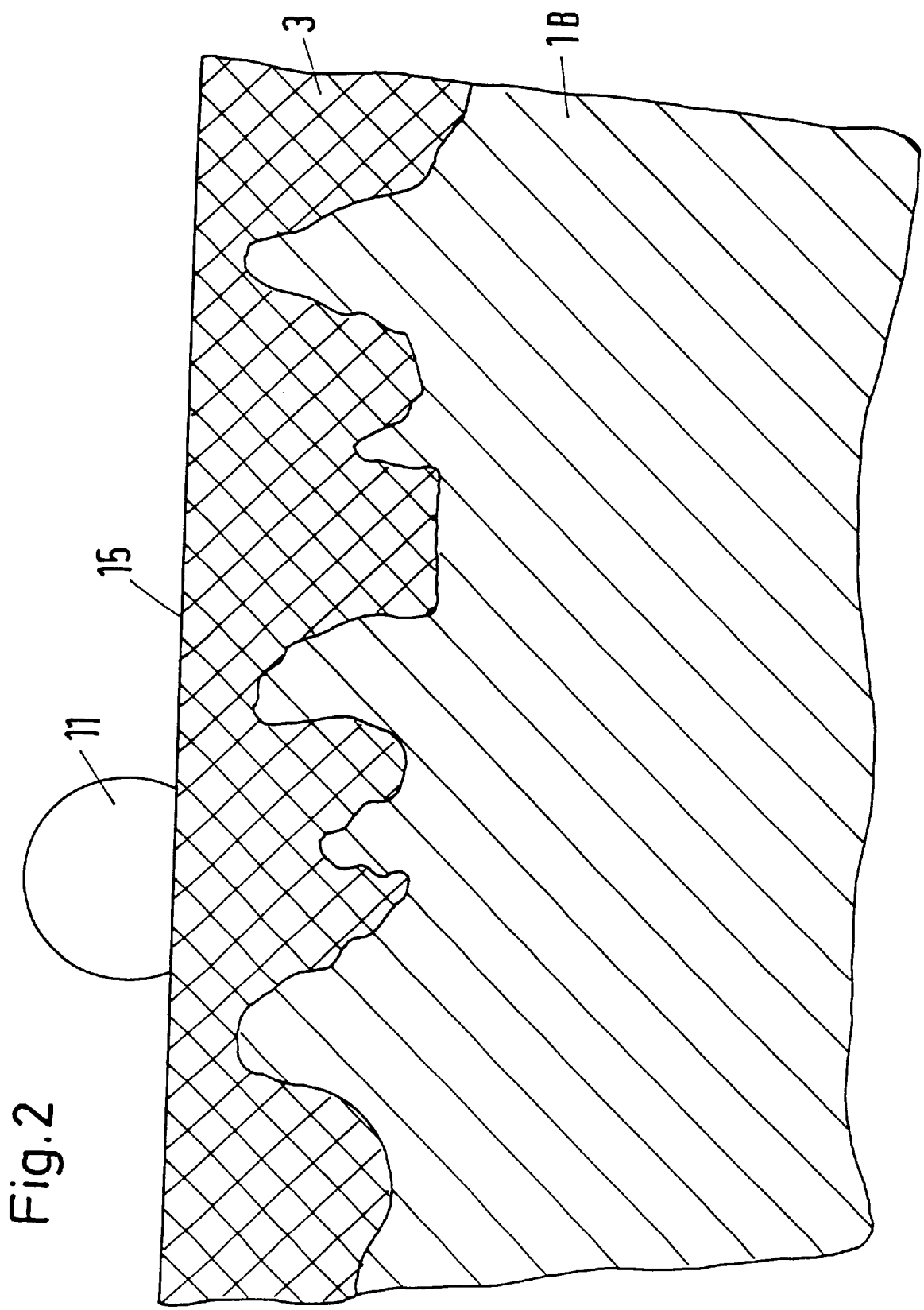
FIG. 2 is an enlarged, fragmentary, sectional view of a coated periphery.

FIG. 2 shows an enlarged representation of a partial region of a periphery 1B. As can be seen from FIG. 2, the coat 3 forms a continuous and at the same time smooth surface 15 made of non-wettable, amorphous carbon. As FIGS. 1 and 2 show, a condensate of a vaporous working fluid 10, which is guided on to the coated components 1 and condenses thereon, does not form a continuous film of liquid. Rather, the condensate only sticks to the coat 3 for a short time in the form of drops 11.

Figure 3:
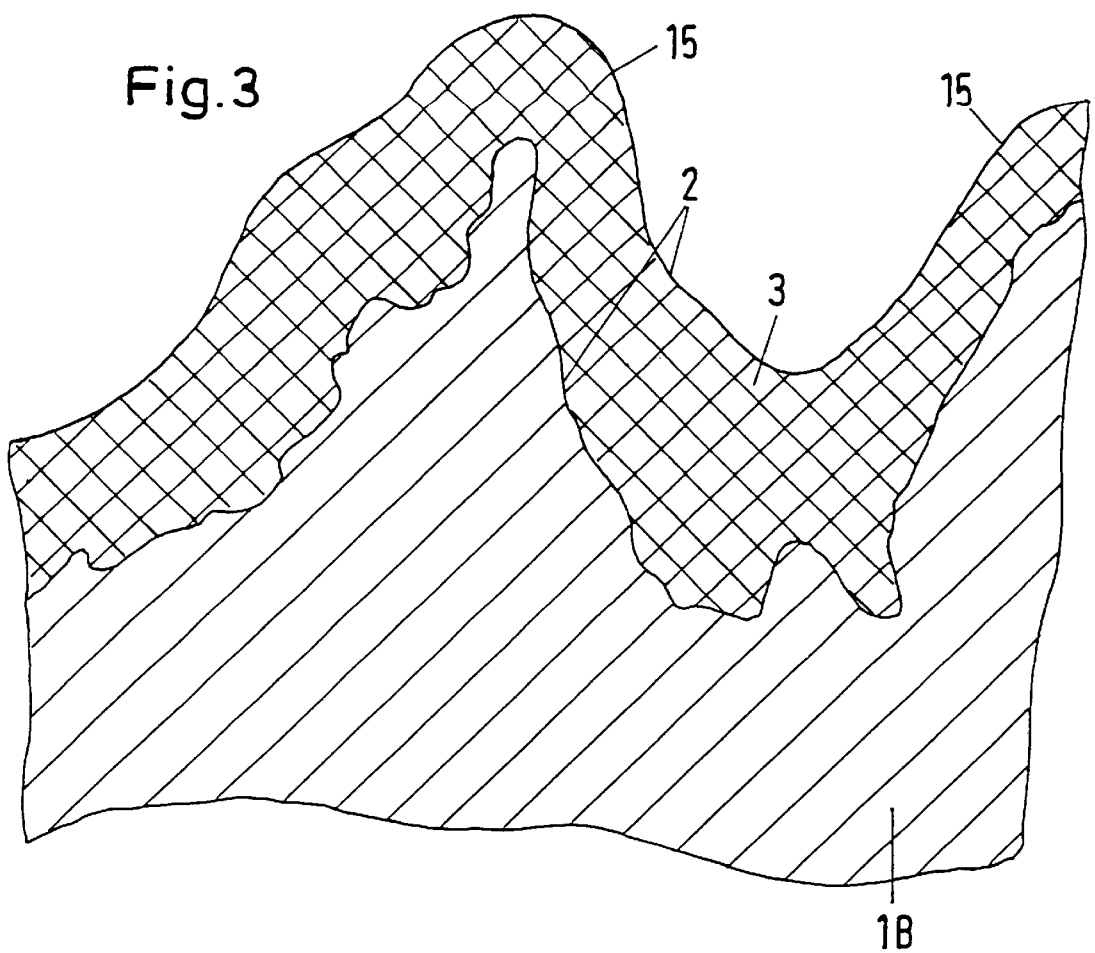
FIG. 3 is a view similar to FIG. 2 of a partially finished periphery.

A further improvement to the heat transfer between a vaporous working fluid and a component coated with non-wettable, amorphous carbon can be achieved by roughening the peripheries to be coated to a depth of 20 $\mu$m using one of the processes described above. As FIG. 3 shows, the coat 3 is then applied, depending on the depth of the roughening, to such a thickness that the periphery 1B is just covered by the non-wettable amorphous carbon, but a smooth surface 15 is not formed. Preferably, with a roughening depth of 20 $\mu$m, the coat 3 is applied to a thickness of up to 5 $\mu$m. The surface 15 is then smoothed mechanically.

Figure 4:
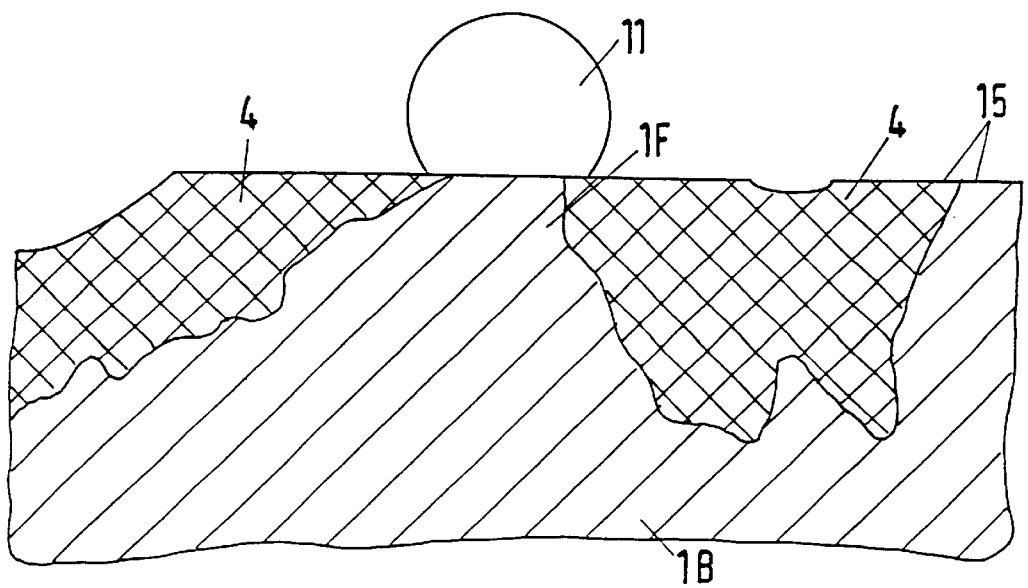
FIG. 4 is another view similar to FIGS. 2 and 3 of a further periphery.

As FIG. 4 shows, after smoothing the surface 15 is formed by regions 4 of non-wettable, amorphous carbon and by exposed regions 1F of the periphery 1B. The result is that the non-illustrated vaporous working fluid in certain regions is in direct contact with uncoated regions 1F of the periphery 1B, as is illustrated by a drop 11 in FIG. 4. This direct contact results in an improved heat transfer.

We claim:
1. In a process for producing a coating on components having peripheries to be brought into direct contact with at least one of vapor and condensate of a medium, the improvement which comprises:
roughening the peripheries of the components to a depth of up to 20 $\mu$m;
applying to the peripheries a coat up to 5 $\mu$m thick of a non-wettable, amorphous carbon with a formula: a-C:H:X, where X is a chemical element selected from the group consisting of fluorine and silicon, to produce coated surfaces having uncoated regions and regions coated with the non-wettable, amorphous carbon; and then smoothing the coated surfaces to produce an overall surface area of the uncoated regions being less than 50% of an overall surface area of the regions coated with the non-wettable, amorphous carbon.

2. The method according to claim 1, wherein said uncoated regions are surrounded by said coated regions.

3. The method according to claim 1, wherein at least one of said uncoated regions and at least one of said coated regions are on one of said surfaces.

4. In a process for producing a coating on components having peripheries to be brought into direct contact with at least one of vapor and condensate of a medium, the improvement which comprises:

roughening the peripheries of each of the components to a depth of between 0.1 mm and 2 mm; and applying to the peripheries a 3 mm to 5 mm thick coat of a non-wettable, amorphous carbon with a structural formula: a-C:H:X, where X is a chemical element selected from the group consisting of fluorine and silicon to produce coated peripheries having uncoated regions and regions coated with the non-wettable, amorphous carbon.

* * * * *